United States Patent
Chang et al.

(10) Patent No.: US 6,660,612 B1
(45) Date of Patent: Dec. 9, 2003

(54) DESIGN TO PREVENT TUNGSTEN OXIDATION AT CONTACT ALIGNMENT IN FERAM

(75) Inventors: Yung Shan Chang, Plano, TX (US); Theodore S. Moise, IV, Dallas, TX (US); Scott R. Summerfelt, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/289,606

(22) Filed: Nov. 7, 2002

(51) Int. Cl.⁷ .................................. H01L 21/76
(52) U.S. Cl. .................. 438/401; 438/462; 438/975
(58) Field of Search ................. 438/401, 462, 438/975; 257/797

(56) References Cited

U.S. PATENT DOCUMENTS

| | | |
|---|---|---|
| 5,872,042 A | 2/1999 | Hsu et al. |
| 6,083,807 A * | 7/2000 | Hsu .......................... 438/401 |
| 6,157,087 A | 12/2000 | Zhao et al. |
| 6,172,409 B1 * | 1/2001 | Zhou .......................... 257/620 |
| 6,261,967 B1 | 7/2001 | Athavale et al. |
| 6,284,654 B1 | 9/2001 | Roeder et al. |
| 6,316,797 B1 | 11/2001 | Van Buskirk et al. |
| 6,326,309 B2 | 12/2001 | Hatanaka et al. |
| 6,352,904 B2 | 3/2002 | Tan et al. |
| 6,395,617 B2 * | 5/2002 | Ando .......................... 438/401 |
| 6,420,791 B1 * | 7/2002 | Huang et al. ................ 257/797 |

OTHER PUBLICATIONS

"FeRAM Tutorial", Ali Sheikholeslami and P. Glenn Gulak, A survey of circuit innovations in Ferroelectric random–access memories, Proceedings of the IEEE, vol. 88, No. 3, May, 2000, 3 pages, taken from the Internet at http://www.eecg.toronto.edu/–ali/ferro/tutorial.html.

"A survey of circuit Innovations in Ferroelectric Random Access Memories", Ali Sheikholeslami and P. Glenn Gulak, Proceedings of the IEEE, vol. 88, No. 5, May, 2000, pp. 667–689.

* cited by examiner

*Primary Examiner*—Coung Nguyen
(74) *Attorney, Agent, or Firm*—Jacqueline J. Garner; W. James Brady, III; Frederick J. Telecky, Jr.

(57) ABSTRACT

One aspect of the invention relates to a method of manufacturing a semiconductor device in which an alignment mark is formed by a plurality of adjacent filled trenches. A processing tool detects the trenches as though they were a single filled trench of larger dimension. When the trenches are metal filled, the metal is more easily protected from oxidation than when the metal is formed into a single large trench, an effect that is pronounced when the trenches are filled with tungsten. Another aspect of the invention relates to an alignment mark formed by a plurality of tungsten filled trenches. The alignment mark can be used to align the pattern for an FeRAM capacitor stack to underlying tungsten contacts.

18 Claims, 6 Drawing Sheets

DESIGN TO PREVENT TUNGSTEN OXIDATION AT CONTACT ALIGNMENT IN FERAM

FIELD OF THE INVENTION

The present invention relates to integrated circuits, and more particularly to an alignment mark suitable for aligning FeRAM capacitors to underlying contacts.

BACKGROUND OF THE INVENTION

The semiconductor industry has long faced a demand for small, portable personal devices. These devices include cellular phones, personal computing equipment, and personal sound systems, which are sought in continuously smaller sizes and with continuously lower power requirements. At the same time that smaller and more portable personal devices are sought, computational power and on-chip memory requirements have increased. In light of these requirements, there has been a long-felt need for computational devices that have substantial memory and logic functions integrated within individual semiconductor chips. Preferably, the memory is configured such that if power is interrupted, as when a battery fails, the contents of the memory are retained. Memory that retains its content without a continuous supply of power is called non-volatile memory. Conventional non-volatile memory types include electrically erasable programmable read only memory (EEPROM) and flash EEPROM.

Ferroelectric random access memory (FeRAM) is a type of non-volatile memory that stores data in memory cells that include capacitors with ferroelectric cores. A ferroelectric core contains a ferroelectric material, such as SBT or PZT, as the dielectric. The non-volatility of FeRAM results from the bi-stable characteristic of ferroelectric materials.

There are single and dual capacitor ferroelectric memory cells. The single capacitor memory cell (referred to as a 1T/1C or 1C memory cell) requires less silicon area and thereby increases the potential density of the memory array, but is less immune to noise and process variations. A 1C cell requires a voltage reference for determining a stored memory state. The dual capacitor memory cell (referred to as a 2T/2C or 2C memory cell) requires more silicon area and stores complementary signals allowing differential sampling of the stored information. The 2C memory cell is more stable than the 1C memory cell.

As illustrated in prior art FIG. 1, a 1T/1C FeRAM cell 100 includes a transistor 110 and a ferroelectric storage capacitor 120. The transistor 110 includes a gate 112, a source 114, and a drain 116. The storage capacitor 120 includes a bottom electrode 122, a top electrode 124, and a ferroelectric core. The drain 116 of the transistor 110 is connected to the bottom electrode 122 of the capacitor 120. The source 114 of the transistor 110 is connected to a bit line 132 (BL). The 1T/1C cell 100 is read by applying a signal to the gate 112 through a word line 130 (WL), switching on the transistor 110. This brings the bottom electrode 122 of the capacitor 120 into communication with the bit line 132. Then, though a drive line 134 (DL), a pulse signal is applied to the top electrode 124 of the capacitor 120. The potential on the bit line 132 becomes the capacitor charge divided by the bit line capacitance. Since the capacitor charge is dependent upon the bi-stable polarization state of the ferroelectric core, the bit line potential can have two distinct values. A sense amplifier (not shown) is connected to the bit line 132 and detects the voltage associated with a logic value of either 1 or 0. Frequently the sense amplifier reference voltage is a ferroelectric or non-ferroelectric capacitor connected to another bit line that is not being read.

Prior art FIG. 2 illustrates a 2T/2C memory cell 200. The memory cell 200 comprises two transistors 202 and 204 and two ferroelectric capacitors 206 and 208, respectively. The first transistor 202 couples between a bit line 210 and the capacitor 206. The second transistor 204 couples between a bit line-bar 212 and the second capacitor 208. The capacitors 206 and 208 are connected to a common drive line 214 (DL), to which a signal is applied for polarizing the capacitors.

In a write operation, the first and second transistors 202 and 204 of the dual capacitor ferroelectric memory cell 200 are enabled via a word line 216 (WL) to couple the capacitors 206 and 208 to the complementary logic levels on the bit line 210 and the bit-line bar 212. The common drive line 214 of the capacitors is pulsed during the write operation to polarize the dual capacitor memory cell 200 to one of two logic states.

In a read operation, the first and second transistors 202 and 204 are enabled via the word line 216 to couple the information stored on the first and second capacitors 206 and 208 to the bit line 210 and the bit line-bar line 212, respectively. A differential signal (not shown) is thus generated across the bit line 210 and the bit line-bar line 212. A sense amplifier (not shown) senses the differential signal and determines the logic level stored in memory.

Forming devices with FeRAM presents several challenges. One such challenge relates to lithographically-patterning the capacitors. Lithography refers to processes for pattern transfer between various media. In lithography for integrated circuit fabrication, the substrate is coated uniformly with a radiation-sensitive film, the resist. The film is selectively exposed with radiation (such as visible light, ultraviolet light, x-rays, or an electron beam) through an intervening master template, the mask or reticle, forming a particular pattern. Exposed areas of the coating become either more or less soluble than the unexposed areas, depending on the type of coating, in a particular solvent developer. The more soluble areas are removed with the developer in a developing step. The less soluble areas remain on the substrate, forming a patterned coating. The pattern of the coating corresponds to the image, or negative image, of the reticle. The patterned coating is used in further processing of the substrate.

When lithographically patterning a capacitor stack for a FeRAM, a challenge arises in aligning the capacitors to contacts with the underlying transistors. Aligning the capacitors generally requires alignment marks on the substrate that can be detected by a lithography tool after deposition of a capacitor stack and resist coating.

Previously, attempts were made to form an alignment mark in the contact layer that is located beneath the capacitor stack. A contact layer includes a dielectric and metal-filled vias forming the contacts. The contact layer tends to obscure detection of alignment marks formed in underlying layers, thus it was natural to try forming new alignment marks when patterning the contact layer in order to facilitate further processing.

When an alignment mark was formed in a tungsten-containing contact layer for FeRAM, it was found to be unreliable due to oxidation. Oxidation occurred while depositing a ferroelectric core, such as a PZT core, which is formed under oxidizing conditions at a temperature of about 600° C. A diffusion barrier layer was present, but was not consistently effective in protecting the alignment marks.

Oxidation distorted the alignment marks and interfered with their function, causing misalignment of the capacitors with respect to the underlying contacts.

A solution to this problem is to mask off the contacts and etch the tungsten from the alignment marks prior to forming the capacitor stack. This solution is effective, but adds to the number of lithographic steps in a process for manufacturing an integrated circuit having FeRAM. The number of lithographic steps required to form an integrated circuit generally has a significant impact on the cost of that circuit. There has long been a demand for integrated circuits and integrated circuit manufacturing processes that require fewer lithographic steps.

SUMMARY OF THE INVENTION

The following presents a simplified summary in order to provide a basic understanding of some aspects of the invention. This summary is not an extensive overview of the invention. It is intended neither to identify key or critical elements of the invention nor to delineate the scope of the invention. Rather, the primary purpose of this summary is to present some concepts of the invention in a simplified form as a prelude to the more detailed description that is presented later.

One aspect of the invention relates to a method of manufacturing a semiconductor device in which an alignment mark is formed by a plurality of adjacent filled trenches. A processing tool detects the trenches as though they were a single filled trench of larger dimension. When the trenches are metal filled, the metal is more easily protected from oxidation than when the metal is formed into a single large trench, an effect that is pronounced when the trenches are filled with tungsten. A further advantage is that groups of small filled trenches tend to present a shallower topographic variation than a single large trench, and thereby better resist dust particle contamination.

Another aspect of the invention relates to an alignment mark and process wherein the alignment mark is formed by a plurality of tungsten filled trenches. The alignment mark can be used to align the pattern for an FeRAM capacitor stack to underlying tungsten contacts.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1:
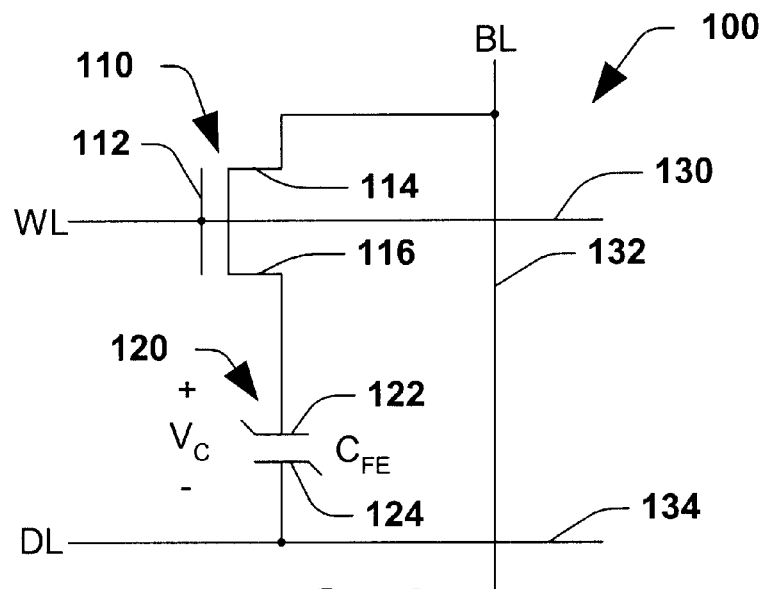
FIG. 1 is a schematic diagram illustrating an exemplary prior art 1T/1C FeRAM memory cell.
Figure 2:
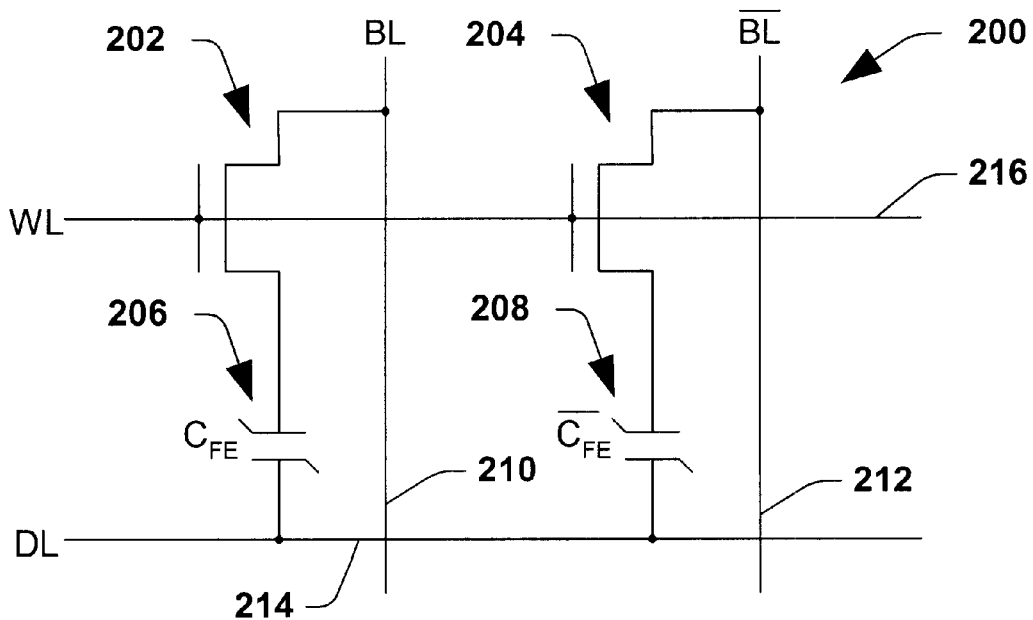
FIG. 2 is a schematic diagram illustrating an exemplary prior art 2T/2C FeRAM memory cell.
Figure 3:
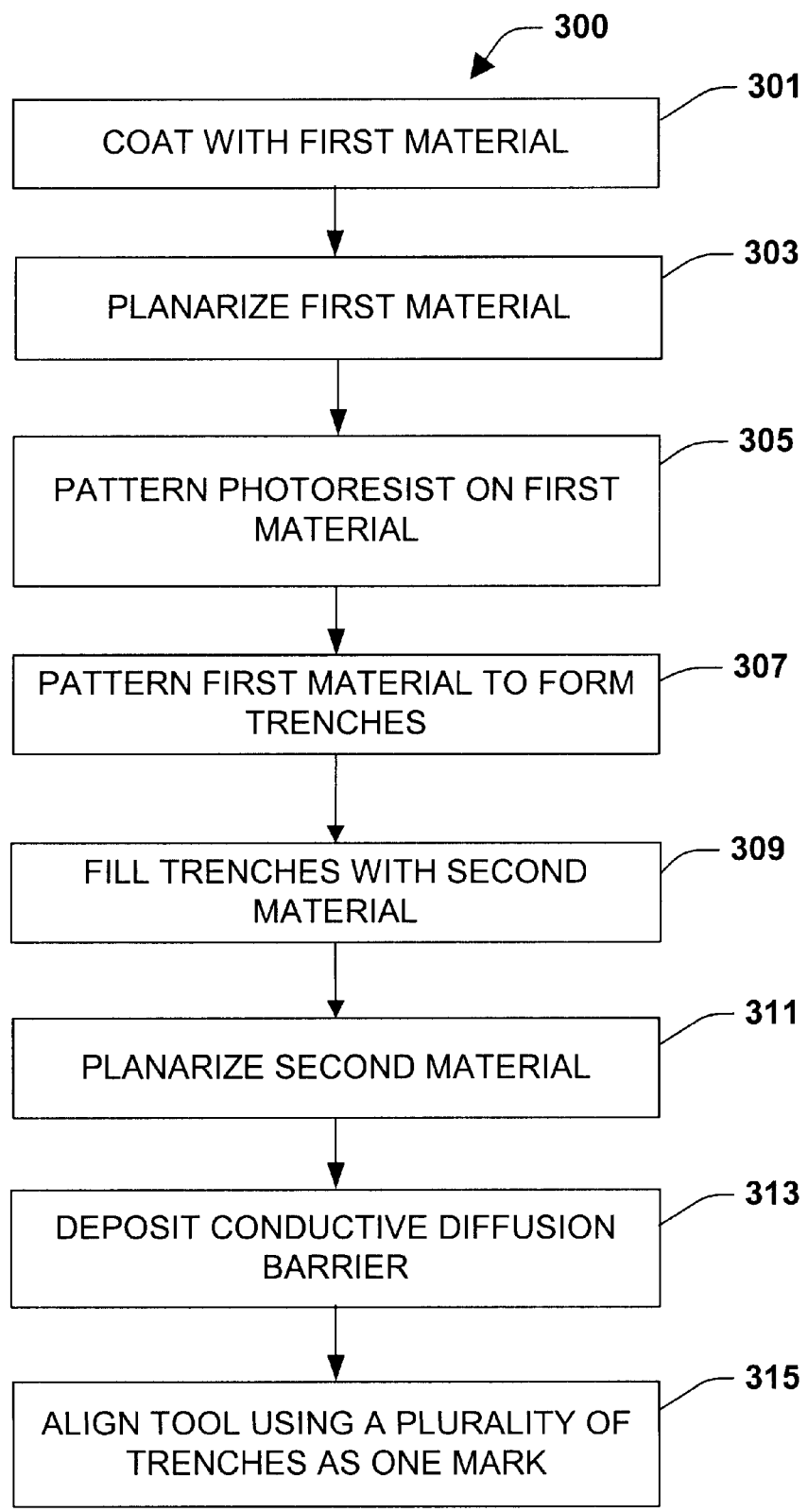
FIG. 3 is a flow chart illustrating a process of forming an alignment mark according to one aspect of the present invention.

The present invention will now be described with reference to the attached drawings, wherein like reference numerals are used to refer to like elements throughout. FIG. 3 is a flow chart of a process 300 according to one embodiment of the present invention. While the exemplary method 300 is illustrated and described hereinafter as a series of acts or events, it will be appreciated that the present invention is not limited by the illustrated ordering of such acts or events, as some acts may occur in different orders and/or concurrently with other acts or events apart from those illustrated and/or described herein, in accordance with the invention. In addition, not all illustrated steps may be required to implement a methodology in accordance with the present invention. It is further noted that the methods according to the present invention may be implemented in association with the devices illustrated and described herein as well as in association with other devices and structures not illustrated.

Process 300 includes in one simplified aspect of the invention, coating a semiconductor substrate with a first material at 301, and patterning the first material to form trenches therein at 307. The method 300 further includes filling the trenches with a second material at 309, planarizing the second material at 311, and aligning a photolithography tool to the filled trenches at 315.

A semiconductor substrate includes a semiconductor, which is typically silicon. Other examples of semiconductors include GaAs and InP. In addition to a semiconductor, the substrate may include various elements therein and/or layers thereon. These can include metal layers, barrier layers, dielectric layers, device structures, active elements and passive elements including silicon gates, word lines, source regions, drain regions, bit lines, conductive lines, and conductive vias.

Act 301 of FIG. 3 comprises coating the substrate with a first material. Typically the first material overlies some topography associated with the substrate. In one embodiment, the first material is a dielectric. Examples of dielectrics include silicon oxide, derived for example from tetraethyl orthosilicate (TEOS) or silane, silicon oxynitride, and silicon nitride. The dielectric can be a dielectric material. Examples of low-k dielectric materials include fluorinated silicon oxide, siloxane SOG (spin-on glass), and polyimides. Specific examples of low-k dielectrics include FLARE 2.0®, a poly-arylene ether available from Allied Signal, Advanced Microelectronic Materials, Santa Clara, Calif., BCB (divinylsiloxane bis-benzocyclobutene), available from Dow Chemical Co., Midland, Mich., and Silk®, an organic polymer similar to BCB also available from Dow. Because there are typically some topographic variations associated with the substrate, the first material is planarized (e.g., via CMP) to form a planar dielectric surface at 303.

Act 305 comprises patterning a photoresist on the first material and then patterning the first material to form trenches therein at 307. The pattern generally includes vias for contacts and may also include trenches to form wiring. However, what is of relevance to the present invention are trenches (going all or partway through the dielectric) used to form alignment marks. According to the present-invention, a plurality of trenches are used to from a single alignment mark and may be positioned in a variety of locations. Preferably, the alignment marks are located in a scribe line region of the wafer adjacent the die.

Figure 4:
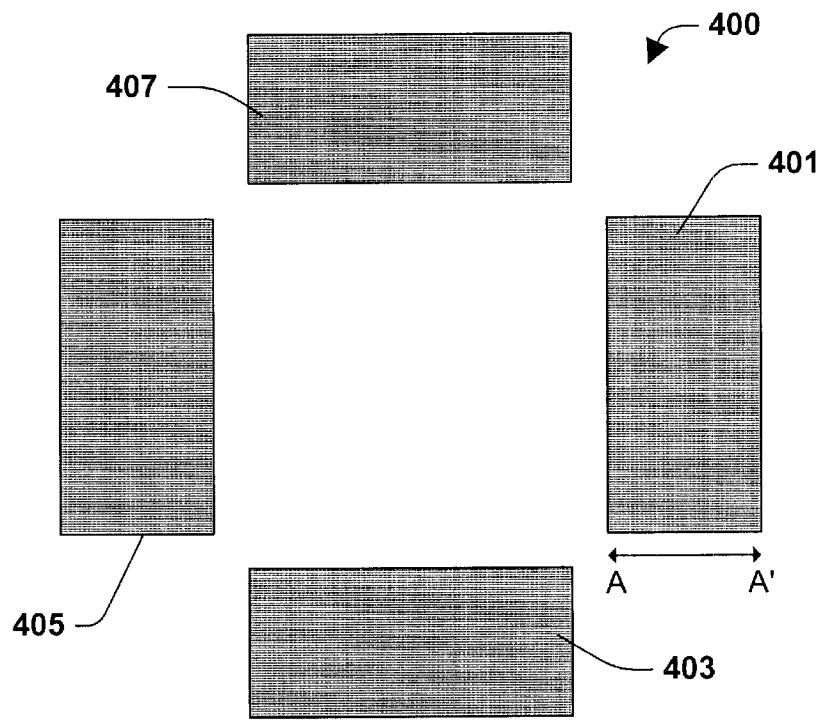
FIG. 4 is a plan view illustration of a prior art alignment target.

For purposes of the present disclosure, an alignment mark is a line, rectangle, or other structure treated as an indivisible feature by a processing tool. Typically, a processing tool will use a plurality of alignment marks to position a mask relative to a substrate. A group of alignment marks that are used together by a processing tool may be referred to as a registration feature or alignment target. Using such an alignment target advantageously facilitates an accurate positioning of the mask relative to the substrate to minimize registration between layers. For example, FIG. 4 illustrates a prior art registration feature 400 composed of alignment marks 401, 403, 405, and 407. The marks have a width AA'.

Figure 5:
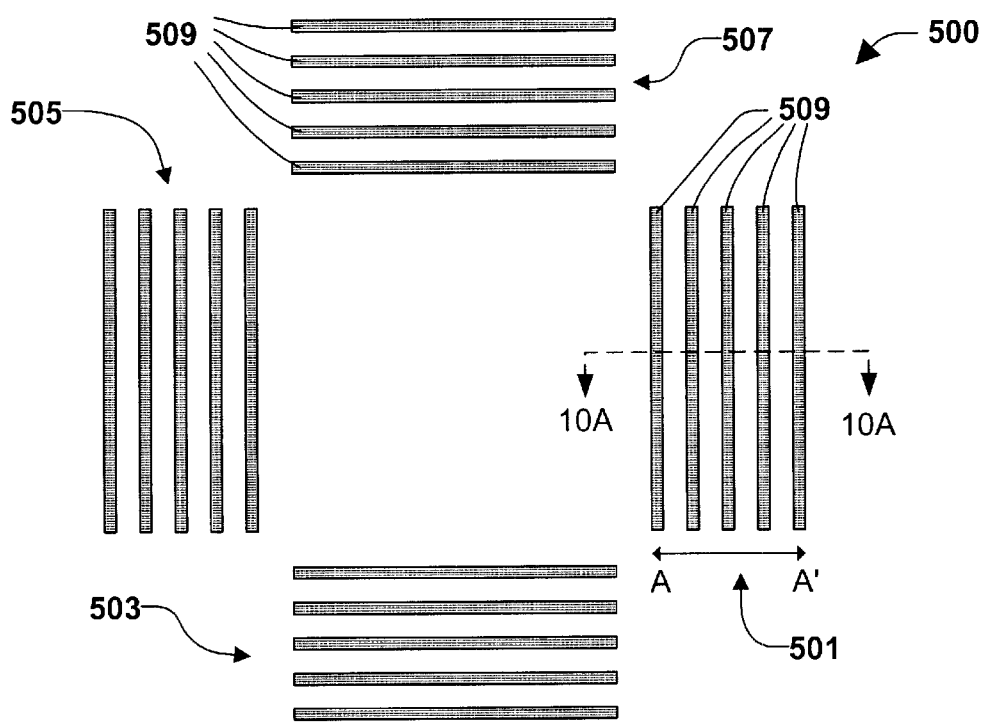
FIG. 5 is a plan view illustration of an alignment target composed of alignment marks according to the present invention.

FIG. 5 illustrates a trench pattern 500 for forming a registration feature like registration feature 400, but composed of alignment marks 501, 503, 505, and 507, which are alignment marks according to one embodiment of the present invention. The alignment marks 501, 503, 505, and 507 are each composed of a plurality of adjacent parallel trenches 509.

Figure 6:
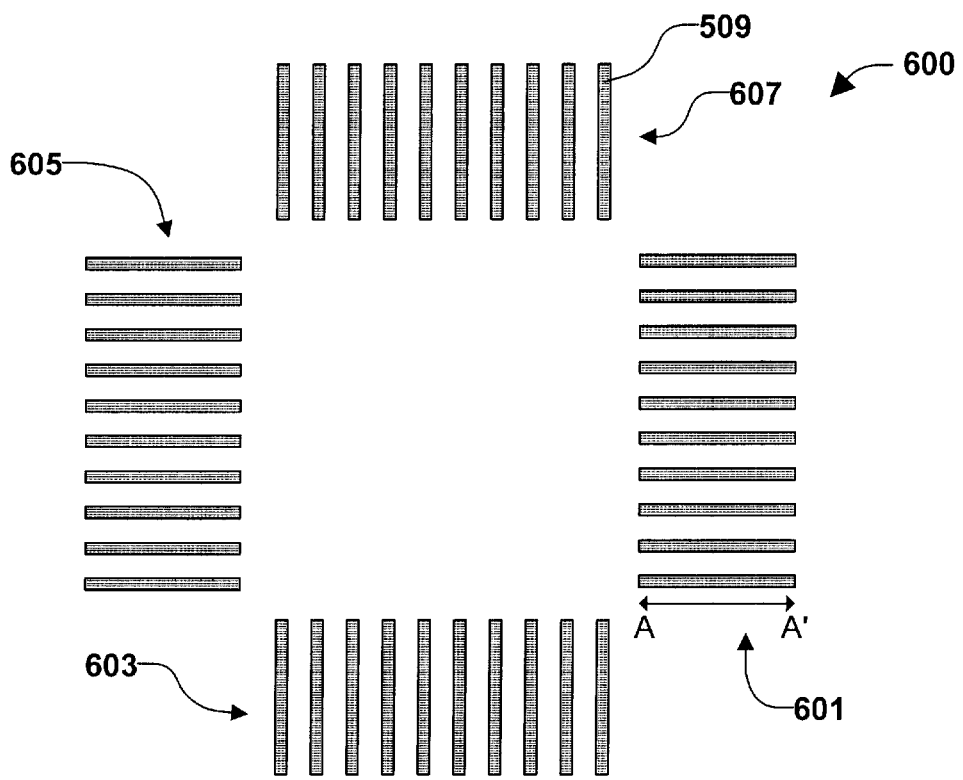
FIG. 6 is a plan view illustration of an alignment target composed of another set of alignment marks according to the present invention.

FIG. 6 illustrates a trench pattern 600 according to another embodiment of the present invention. Like the trench pattern 500, the trench pattern 600 forms a registration feature that is recognized by a processing tool as the registration feature 400, although the trenches of the pattern 600 are oriented perpendicular to the trenches of the pattern 500.

Figure 7:
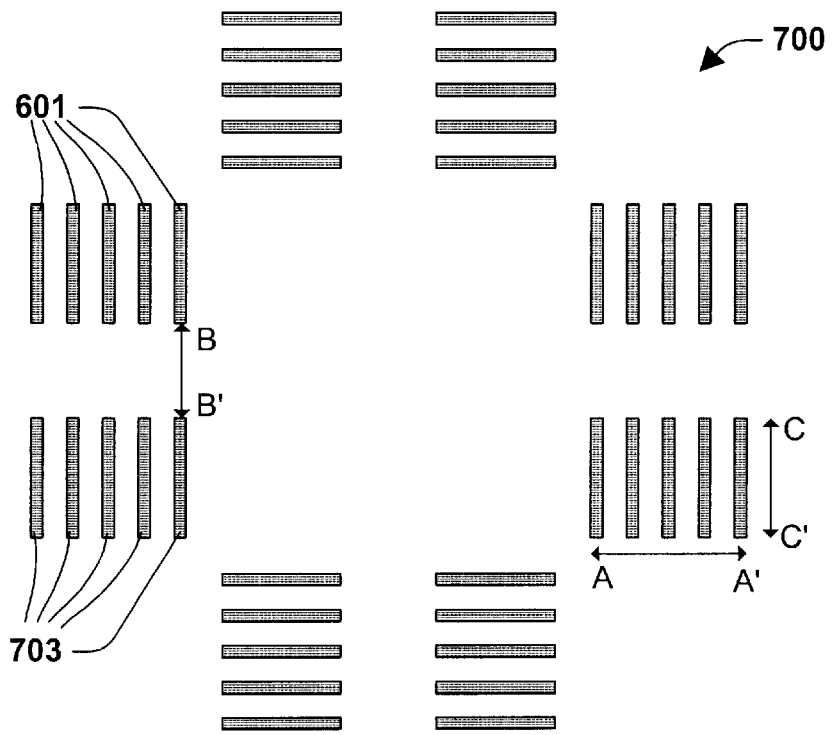
FIG. 7 is a plan view illustration of an alignment target composed of a further set of alignment marks according to the present invention.

FIG. 7 illustrates a trench pattern 700 according to a still further embodiment of the present invention. The pattern 700 forms either four or eight alignment marks, depending on the distance BB'. If the distance BB' is small, the pattern will appear to the alignment tool as four alignment marks and will appear like a registration feature that is like registration feature 400. If the distance BB' is relatively large, a processing tool may identify eight separate alignment marks, having widths of either AA' or CC', whichever is smaller, and may not treat the group as the registration feature 400.

Figure 8:
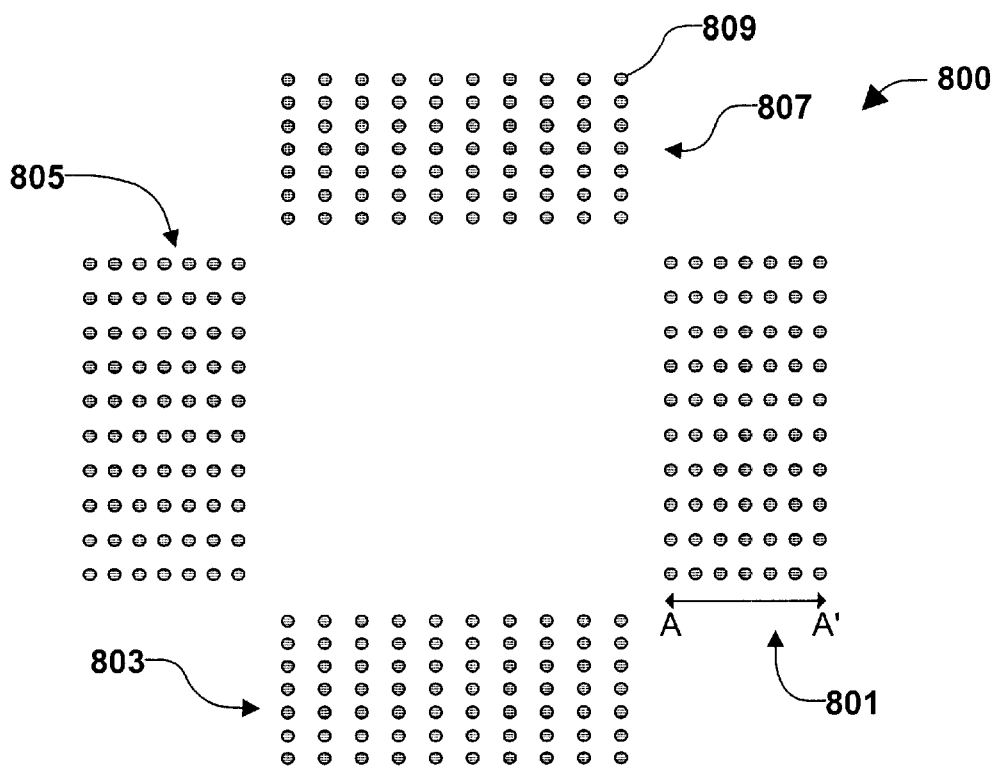
FIG. 8 is a plan view illustration of an alignment target composed of a still further set of alignment marks according to the present invention.

FIG. 8 illustrates a trench pattern 800 according to yet another embodiment of the present invention. The pattern 800 forms four alignment marks, 801, 803, 805, and 807 and forms a registration feature functionally equivalent to the registration feature 400. The alignment marks 801, 803, 805, and 807 are each formed from an array of generally circular trenches 809.

The individual trenches have a width that is less than the width of the original alignment marks they are used in the aggregate to form. The width of a rectangular trench, like one of the trenches 509, is the length of the shortest side. The width of a circular trench, like one of the trenches 809, is approximately the diameter. The width of a trench affects the integrity of a TiN coating over the trench when the trench is tungsten filled. The width of a trench also affects topography, as discussed in more detail later. In general, narrower trenches result in better coating integrity and milder topographical variations.

While an alignment mark is generally from about 1 um to about 10 um wide, the trenches of the present invention are preferably about 0.5 um or less in width, more preferably about 0.4 um or less, and about 0.25 um or more. The spacing between adjacent trenches is preferably about 1.0 um or less, more preferably about 0.6 um or less, and still more preferably about 0.4 um or less. Preferably, 2 to about 10 adjacent trenches are used to span the width of an alignment mark, more preferably 3 to about 7.

It was appreciated by the inventors of the present invention, that for the alignment tool to properly see the multiple trenches as a single mark, some dimensional and functional requirements are preferred. For example, trench width values of about 0.5 um or less have been found to be advantageous because the second material (e.g., tungsten) can fill the trench and leave little first material exposed therein (and thus minimizes potential negative effects of oxidation if high temperature processing occurs subsequently). Concurrently, however, it has been found that a trench width of greater than about 0.25 um is advantageous so that the alignment tool light source provides sufficient optical contrast. For example, if the alignment tool employs an Hg light source with a wavelength of about 530–800 nm, a trench width of less than about 0.25 um is about ⅓ to about ½ the light wavelength and thus beyond the tool resolution capability, leading to poor image contrast. It should be understood, however, that differing tools employing different type light sources may work for different size trenches and such variations are contemplated as falling within the scope of the present invention.

Similarly, the inventors of the present invention have appreciated that the spacing between neighboring trenches is not arbitrary. Rather, a space value between trenches should be sufficiently large so that the first material provides sufficient physical support for less dishing during second material planarization. Concurrently, however, one wants the space to be small enough so that a group of multiple trenches and spaces will appear as a single mark or image to the alignment tool. For example, if the space gets too large, the alignment tool may see multiple optical peaks rather than a single large peak as desired, and the multiple peaks may result in poor alignment. Space distances of less than about 0.7 um have been found to minimize the multiple peaks with the above-described tool, however, variations associated with the tools are contemplated by the present invention.

Act 309 comprises filling the trenches with a second material. In one embodiment, the second material is a metal. Examples of metals include tungsten, aluminum, copper, and alloys thereof. The trenches can be filled by any suitable method, for example, sputter deposition or CVD. On one exemplary aspect of the invention, the trenches are formed concurrently with the formation of vias (e.g., VIA0) down to active circuitry and the trenches are filled with tungsten concurrently with filling the vias down to active circuitry with tungsten. Generally, the metal overfills the trenches and covers the surface of the first material.

Act 311 comprises planarizing the second material. The term planarizing encompasses those procedures by which material is removed to substantially restrict the first material to the trenches formed at 307. Any suitable procedure can be used, including for example plasma etching, reactive ion etching, mechanical polishing, or chemical mechanical polishing (CMP), with CMP being preferred. The planarizing of the second material may also result in a slight planarization of the first material on a top surface thereof.

Planarizing is a misnomer to the extent it is interpreted as forming a strictly planar surface of the first and second materials. While at a gross or macroscopic level planarizing makes the first and second materials substantially planar, a close inspection of the planarized surface reveals small, but generally significant variations.

Figure 9:
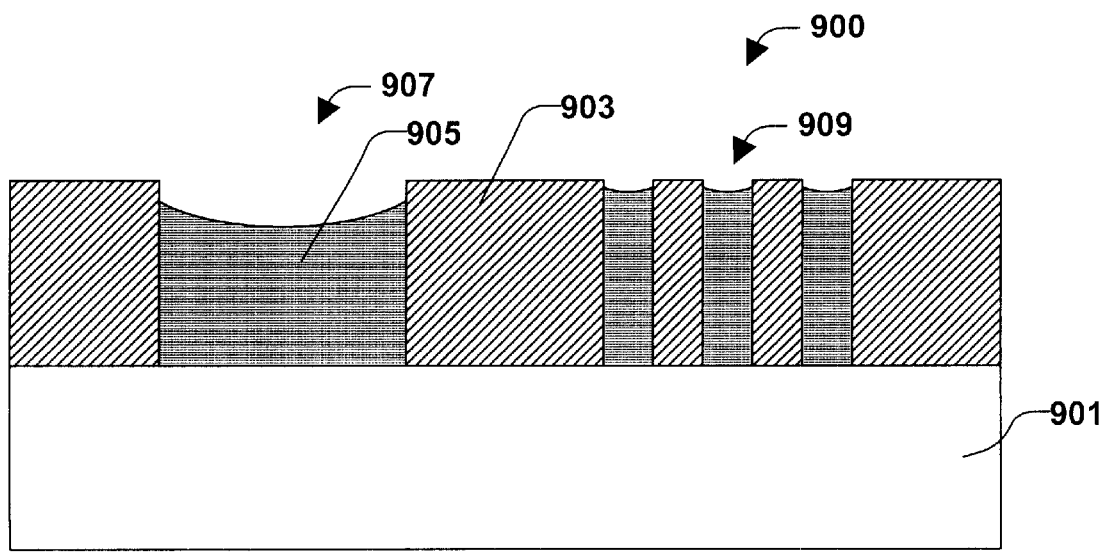
FIG. 9 is a schematic illustration of a chemically mechanically polished substrate including large and small filled trenches.

FIG. 9 illustrates a device 900, including a substrate 901, a first material 903, and a second material 905 planarized by CMP. The second material 905 fills broad trenches 907 and narrow trenches 909. However, because the second material 905 is more susceptible to polishing than the first material 903, there is a drop-off of, for example, several hundred Angstroms at the edges of the trenches and the trenches have a generally concave profile. The depths at the centers of the trenches are proportional to their widths. The narrower trenches are shallower and provide a more level surface. A more level surface can be advantageous in further processing of a device. For example, a more level surface is more resistant to dust particle contamination.

While most planarizing techniques seek to minimize topographic variations, the inventors of the present invention discovered and appreciated that some surface variation can be advantageous in forming an alignment mark. Variations, including the drop-off at the trench edge and change in the angle at which the surface reflects light, facilitate detection of alignment marks formed of one or more trenches. Topographic variations can be used to detect an alignment mark covered by opaque layers, provided that the covering layers are generally conformal. Generally, no special effort is required to produce a topographic variation, as topographic variations are very difficult to avoid in planarizing processes.

After planarizing the first and second materials at 311, a conductive diffusion barrier layer may be deposited thereover, for example, via chemical vapor deposition (CVD) at 313. As will be appreciated, use of such a barrier may be advantageous depending on the device application, for example, in FeRAM processing to serve as a diffusion barrier. Such an act, however, is optional.

Act 315 comprises aligning a processing tool to the substrate using one or more alignment marks formed from a plurality of filled trenches. Due to the size and spacing of the trenches relative to a detection system used by the tool, the plurality of filled trenches appear to the tool as a single alignment mark.

The processing tool can be a lithographic or an inspection tool and can employ any suitable alignment system. The alignment system can employ bright field, dark field, through the lens, off-axis, wide wavelength range, narrow wavelength range, or single wavelength illumination. The system can detect reflected light, diffracted light, or some combination thereof. The tool can be configured to detect alignment targets such as required by Nikon, Cannon, SVGL, and ASML alignment systems, including Nikon's laser scan alignment (LSA), field image alignment (FIA), and laser Interference Alignment (LIA) systems, and the ASML ATHENA system.

While the alignment system may detect diffracted light, the alignment system does not use the alignment mark as a grating. A grating generates a periodic pattern that depends on the spacing between trenches. Such a pattern can be used in aligning a substrate, however, according to the present invention, the alignment system uses the alignment mark in a manner that is independent of the particular size of any regular spacing between the plurality of trenches forming the alignment mark. According to the present invention, the alignment system treats the plurality of trenches as one large trench, as opposed to a diffraction grating.

The present invention is useful in manufacturing FeRAM, and in particular is useful in patterning a capacitor stack for FeRAM. In one embodiment, an alignment mark of the present invention is detected while covered by the capacitor stack. Typically, the capacitor stack includes at least a top electrode layer, a dielectric core, a bottom electrode layer, and a bottom diffusion barrier layer.

In another embodiment, the dielectric core includes a ferroelectric material. Examples of ferroelectric materials include PZT, barium strontium titanate, barium titanate, bismuth titanate, lead lanthanum zirconate titanate, lead niobium zirconium titanate, and layered perovskite-like materials. The ferroelectric material may be donor and/or acceptor doped to enhance its ferroelectric and electrical properties. The ferroelectric core can be formed under oxidizing conditions and at a temperature of at least about 500° C., or of at least about 550° C. The dielectric core is preferably from about 10 to about 150 nm thick, more preferably from about 15 to about 100 nm thick, and still more preferably from about 21 to about 30 nm thick.

The top and bottom electrode layers can include one or more sub-layers of any suitable material. Examples of suitable materials for electrode sub-layers include Pt, Pd, Au, Ag, Ir, Rh, Ru and oxides thereof. The electrode layers are preferably from about 10 to about 200 nm thick, more preferably from about 20 to about 100 nm thick, and still more preferably from about 27 to about 55 nm thick. The electrode layers and dielectric core can be formed by any suitable processes, including, for example, sputter deposition and/or CVD.

The bottom diffusion barrier layer can comprise any suitable material. Examples of diffusion barrier materials include TiN, TiAlN, and TiAlON. The bottom diffusion barrier layer prevents oxidation of the alignment mark during formation of the dielectric core.

The width and spacing of trenches can be varied to optimize contrast and reproducibility. In any given application, the optimum dimensions can be determined by trial and error.

In the FeRAM application using tungsten filled $SiO_2$ trenches, good results have been obtained with trenches about 0.2, 0.3, 0.4, and 0.5 um wide. Spacing between trenches has been about the same or a little less than width. Numbers of trenches from 3 to 7 have been used and the trenches have been oriented either parallel or perpendicular to the alignment marks they have formed. These trenches have been used to form Nikon LSA, FIA, and KLA alignment marks.

Figure 10A:
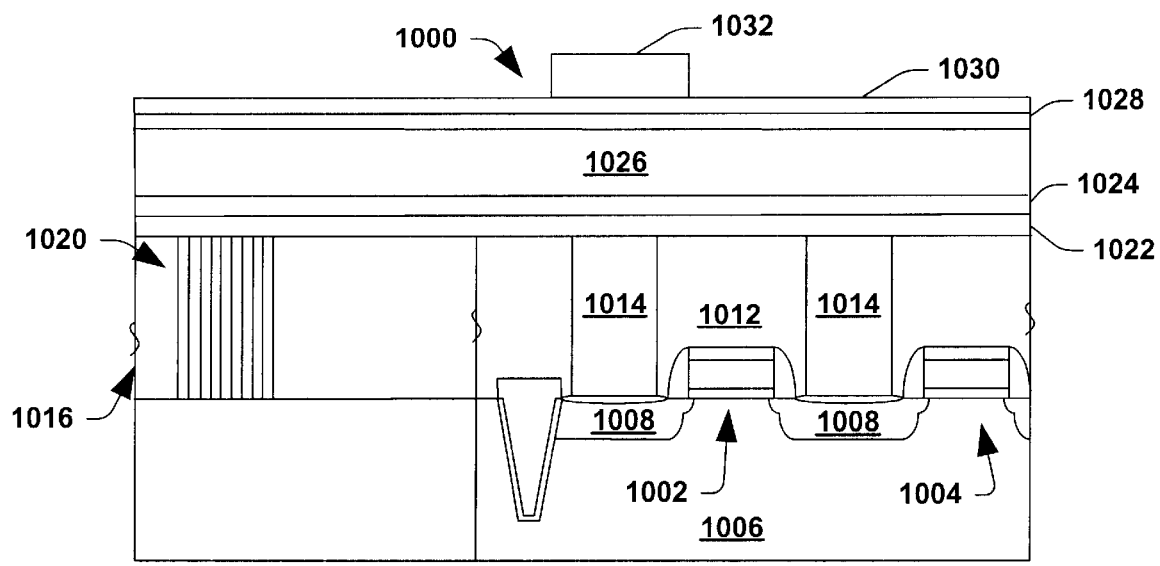
FIG. 10A is a fragmentary cross section illustrating formation of capacitor stack layers in an FeRAM device and use of an alignment mark in accordance with the present invention to align a lithography tool for patterning a hard mask associated therewith.

The use of narrow trenches as alignment marks to form a macroscopic alignment target in the formation of an FeRAM device will now be described in conjunction with FIGS. 10A and 10B. In FIG. 10A, a portion of an FeRAM device 1000 is illustrated in which a selection transistor 1002 and another transistor 1004 are formed in a semiconductor substrate 1006 having source/drain regions 1008 therein, respectively, and gate structures 1010. A dielectric material 1012, for example, $SiO_2$, is formed over the transistors 1002 and 1004 and via holes are formed within the dielectric for provision of electric contact to the transistors. At the same time the via holes are formed, narrow trenches 1020 are formed in the dielectric 1012, for example, in a region 1016 corresponding to a scribe line. The vias and trenches are then filled with a conductive material such as tungsten 1014 and planarized via, for example, CMP. The trenches 1020 illustrated in FIG. 10A correspond to a portion of the alignment target, for example, the portion labeled 10A—10A in FIG. 5. The pattern of trenches 1020 may correspond, for example, to the various patterns described above and illustrated in FIGS. 5–8 according to the present invention.

Still referring to FIG. 10A, various layers corresponding to the ferroelectric capacitor are deposited in succession such as a bottom electrode diffusion barrier 1022, a bottom electrode layer 1024, a ferroelectric dielectric layer 1026, a top electrode layer 1028 and a hard mask layer 1030. Subsequently, a photoresist layer 1032 is deposited and patterned or developed using a mask. During such patterning or development of the photoresist, the alignment target 1020 is employed by a lithography tool to properly align the mask to ensure the resultant photoresist feature 1032 of FIG. 10A is properly aligned because, as will be further appreciated below, alignment thereof allows the subsequent capacitor stack to be patterned with as small a critical dimension as possible without substantial alignment tolerances added to ensure contact to the underlying tungsten 1014.

Still referring to FIG. 10A, the alignment target composed of the trenches 1020 is visible to the inspection tool at a top portion 1040 of the stack when aligning the mask for subsequent patterning of the hard mask layer 1030. The trenches 1020 are visible to the tool through the layers because of the phenomena illustrated in FIG. 9. That is, when the CMP planarizes the layer to remove excess tungsten, dishing occurs on the microscopic level. Such dishing, when the trenches are about 0.5 um or less in width, is sufficient to cause extremely small topographical differences in overlying layers. Although such topographical differences may be too small to distinguish standing alone, groupings of such trenches (e.g., as illustrated in FIGS. 5–8) make groupings of topographical differences that can be viewed as a macroscopic alignment mark. In such a manner, a collection of trenches similar to that illustrated in FIGS. 5–8 will appear to the inspection tool as a macroscopic alignment target similar to that illustrated in FIG. 4. In addition, since the trenches are small, the dishing is not significant enough to cause potential tungsten exposure problems that would disadvantageously result in mark deformity or distortion due to oxidation. Therefore the alignment mark trenches and resulting alignment target of the present invention advantageously provides an effective alignment mechanism without additional masks or processing steps.

Figure 10B:
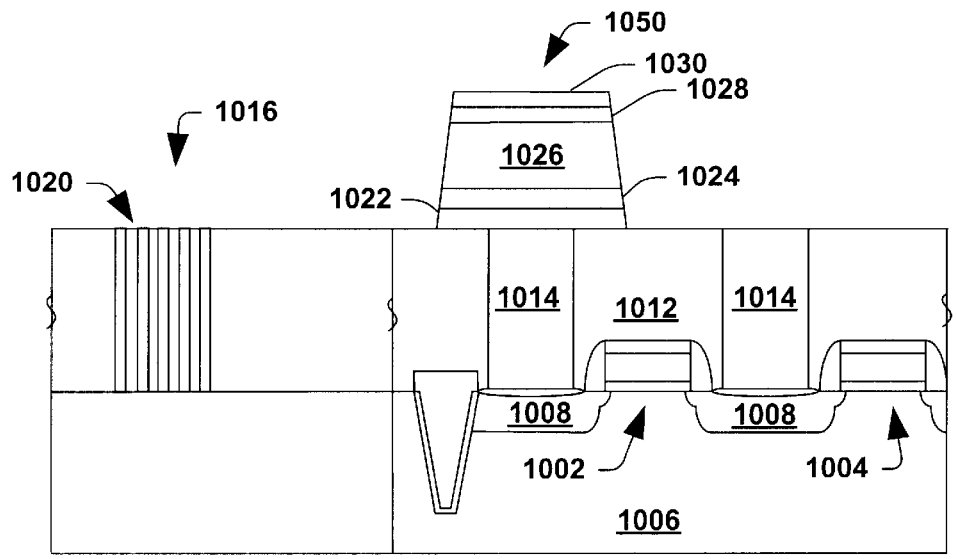
FIG. 10B is a fragmentary cross section illustrating formation of the capacitor stack using the aligned, patterned hard mask according to the present invention.

Turning now to FIG. 10B, the hard mask layer 1030 is patterned using the developed photoresist feature 1032 of FIG. 10A. Subsequently, using the patterned hard mask 1030, each of the underlying capacitor layers (layers 1028, 1026, 1024 and 1022) are patterned and thus are self-aligned with respect to the hard mask 1030 to form a capacitor stack 1050. As can be seen in FIG. 10B, by properly aligning the hard mask, the capacitor stack 1050 overlies a tungsten contact 1014 to connect the capacitor to the selection transistor 1002. If the capacitor stack 1050 is not properly aligned over the contact 1014, increased resistivity or a discontinuity could occur, and designers would be forced to make the capacitor stack wider to compensate for potential misalignment. With the alignment trenches 1020 of the present invention, alignment of the mask employed to define the hard mask is obtained which then allows misalignment tolerances associated therewith to be reduced substantially. Accordingly, the critical dimension of the capacitor stack 1050 is reduced, advantageously allowing for improved FeRAM memory cell density.

Although the trenches 1020 were described above in the context of a FeRAM device fabrication, the trenches of the present invention may be employed as an alignment target in the formation of any type of semiconductor device and at any one of various stages in the fabrication thereof. All such implementations are contemplated as falling within the scope of the present invention.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

What is claimed is:

1. A method of manufacturing a semiconductor device, comprising:
    aligning a semiconductor substrate to a processing tool by acts comprising:
        coating the substrate with a first material;
        patterning the first material to form a plurality of adjacent trenches having a location on the substrate;
        filling the trenches with a second material to form a plurality of filled trenches;
        planarizing the first and second materials; and
        translating the semiconductor substrate relative to the tool according to the location of the filled trenches;
    wherein the tool responds to the filled trenches as a single alignment mark and determines their location independent of any spacing between adjacent trenches.

2. The method of claim 1, wherein the tool detects the filled trenches through a topographical variation caused by the filled trenches in a layer overlaying the filled trenches.

3. The method of claim 1, wherein the tool detects the filled trenches using broad band radiation.

4. The method of claim 1, wherein the second material consists essentially of tungsten.

5. The method of claim 1, wherein the tool employs the filled trenches in aligning a pattern for a ferroelectric memory capacitor stack with respect to contacts underlying the capacitor stack.

6. The method of claim 1, wherein the individual trenches are from about 0.25 to about 0.5 um wide.

7. The method of claim 6, wherein a spacing between the trenches is about 0.7 um wide or less.

8. The method of claim 6, wherein the first material is a dielectric, the second material is a metal, and the plurality of filled parallel trenches comprise two to about 10 adjacent trenches collectively spanning a width from about 1 to about 10 um.

9. A method of forming an alignment mark for patterning an FeRAM capacitor stack, comprising:

coating a semiconductor substrate with a dielectric;

patterning the dielectric to form a plurality of trenches therein;

filling the trenches with metal; and planarizing the metal and the dielectric layer;

wherein the plurality of trenches filled with metal form the alignment mark.

10. A method of patterning a capacitor stack, comprising:

forming an alignment mark according to the method of claim 9, and aligning a photolithography by detecting a topographical variation caused by the alignment mark.

11. A method of patterning a capacitor stack, comprising:

forming an alignment mark according to the method of claim 9, and detecting the alignment mark using broad band radiation.

12. The method of claim 9, wherein the metal consists essentially of tungsten.

13. The method of claim 9, further comprising forming the FeRAM capacitor stack over the alignment mark, wherein the alignment mark can be detected by a photolithography tool with the capacitor stack in place.

14. The method of claim 13, wherein the capacitor stack includes a dielectric core formed in an oxidizing atmosphere at a temperature of at least about 550° C.

15. The method of claim 14, wherein a diffusion barrier layer protects the tungsten in the alignment mark from oxidation while the capacitor stack is formed.

16. The method of claim 9, wherein the individual trenches are from about 0.1 to about 0.5 um wide.

17. The method of claim 16, wherein a spacing between the trenches is about 0.7 um wide or less.

18. The method of claim 16, wherein the plurality of trenches comprise two to about 10 adjacent trenches collectively spanning a width of the alignment mark, the width being from about 1 to about 10 um.

* * * * *